United States Patent
Kim et al.

(10) Patent No.: US 11,664,204 B2
(45) Date of Patent: May 30, 2023

(54) PLASMA DEVICE HAVING EXCHANGEABLE HANDPIECE

(71) Applicant: FEMTO SCIENCE INC, Hwaseong-si (KR)

(72) Inventors: Moo Hwan Kim, Hwaseong-si (KR); Yeon Sook Chang, Hwaseong-si (KR)

(73) Assignee: FEMTO SCIENCE INC, Hwaseong-si (KR)

( * ) Notice: Subject to any disclaimer, the term of this patent is extended or adjusted under 35 U.S.C. 154(b) by 280 days.

(21) Appl. No.: 17/103,011

(22) Filed: Nov. 24, 2020

(65) Prior Publication Data

US 2021/0225620 A1 Jul. 22, 2021

(30) Foreign Application Priority Data

Jan. 17, 2020 (KR) ........................ 10-2020-0006433

(51) Int. Cl.
*H01J 37/32* (2006.01)

(52) U.S. Cl.
CPC .. *H01J 37/32807* (2013.01); *H01J 37/32036* (2013.01); *H01J 37/32449* (2013.01)

(58) Field of Classification Search
CPC ........... H01J 37/32807; H01J 37/32036; H01J 37/32449
See application file for complete search history.

(56) References Cited

U.S. PATENT DOCUMENTS

| 3,834,392 A | 9/1974 | Lampman et al. |
| 5,041,110 A | 8/1991 | Fleenor |
| 2012/0029506 A1 | 2/2012 | Johnson |
| 2013/0202496 A1* | 8/2013 | Konesky ........... H01J 37/32568 422/186 |

(Continued)

FOREIGN PATENT DOCUMENTS

| EP | 2 914 070 A1 | 9/2015 |
| JP | 11-290334 A | 10/1999 |

(Continued)

OTHER PUBLICATIONS

Japanese Office Action for related JP application No. 2020-194430 dated Jan. 11, 2022 from Japanese Patent Office.

(Continued)

*Primary Examiner* — Abdullah A Riyami
*Assistant Examiner* — Syed M Kaiser
(74) *Attorney, Agent, or Firm* — Paratus Law Group, PLLC

(57) ABSTRACT

Disclosed is a plasma device which includes: a base including a power supply unit configured to receive electric power and form an AC signal, a gas flow rate adjustment unit configured to receive gas and control a flow rate of output gas, an input unit configured to receive an input of a user, and a controller configured to control the power supply unit and the gas flow rate adjustment unit according to the input; and a handpiece including a boosting transformer configured to boost the AC signal, an electrode structure configured to (Continued)

receive the boosted AC signal and the gas and form plasma, a switch configured to receive a plasma discharge signal of the user, and a nozzle configured to discharge the formed plasma, wherein the handpiece is connected to the base via a connector and is exchangeable.

10 Claims, 10 Drawing Sheets

(56) References Cited

U.S. PATENT DOCUMENTS

| | | |
|---|---|---|
| 2013/0237982 A1 | 9/2013 | Rencher et al. |
| 2019/0046809 A1 | 2/2019 | Kang |

FOREIGN PATENT DOCUMENTS

| | | | | |
|---|---|---|---|---|
| JP | 11290334 A | * | 10/1999 | |
| JP | 2004-520864 A | | 7/2004 | |
| JP | 2006-100078 A | | 4/2006 | |
| JP | 2006181353 A | * | 7/2006 | ........... A61B 18/042 |
| JP | 2007526063 A | * | 9/2007 | |
| JP | 2015-160134 A | | 9/2015 | |
| JP | 2017-050267 A | | 3/2017 | |
| JP | 2020-500070 A | | 1/2020 | |
| KR | 10-1171091 B1 | | 8/2012 | |
| KR | 10-1422823 B1 | | 8/2014 | |
| KR | 10-2017-0083903 A | | 7/2017 | |
| KR | 20170083903 A | * | 7/2017 | |
| KR | 10-2042559 B1 | | 12/2019 | |

OTHER PUBLICATIONS

Korean Office Action for related KR Application No. 10-2020-0006433 dated Feb. 19, 2022 from Korean Intellectual Property Office.
Extended European Search Report for related EP application No. 20207734.3 dated May 10, 2021 from European Patent Office.
Korean Office Action for related KR Application No. 10-2020-0006433 dated Jul. 27, 2021 from Korean Intellectual Property Office.
Japanese Office Action for related JP application No. 2020-194430 dated Jul. 26, 2022 from Japanese Patent Office.

* cited by examiner

PLASMA DEVICE HAVING EXCHANGEABLE HANDPIECE

CROSS-REFERENCE TO RELATED APPLICATION

This application claims priority to Korean Patent Application No. 10-2020-0006433 filed on Jan. 17, 2020, which is hereby incorporated by reference in its entirety.

BACKGROUND

The present technology relates to a plasma device having an exchangeable handpiece.

Plasma is a gas consisting of positively charged ions (and negatively charged ions in rare cases) and free electrons, which are atoms from which orbital electrons have been removed and refers to a state in which gas is heated by a heat source or subjected to a strong electric field, and is thus divided into particles such as electrons, neutral particles, and ions beyond a gaseous state. Plasma has been mainly used for surface modification, coating, sterilization, disinfection, and the like of materials, and is recently widely used in the beauty field as well as the biomedical field.

SUMMARY

Plasma may have various modes including a remote mode in which the plasma is discharged to a nozzle by the pressure of generated and introduced gas, a direct mode in which the plasma is accelerated and discharged by an electric field, and the like.

A plasma device for industrial use according to the related art generally has a structure for discharging plasma to a film to be surface-modified or the like in a large area. A small-sized plasma device is limited to providing the plasma to a local area using a small pin type nozzle. Thus, when plasma treatment is performed on a relatively large area using a small-sized plasma generator or a user wants to use the plasma in different modes, a plasma generation device corresponding to the purpose should be purchased and used.

The present technology is for solving the above-described difficulties of the related art. One of the problems to be solved by the present technology is to provide a plasma device that can simply change characteristics of provided plasma by exchanging a handpiece.

A plasma device according to the present embodiment includes: a base including a power supply unit configured to receive electric power and form an alternating current (AC) signal, a gas flow rate adjustment unit configured to receive gas and control the flow rate of output gas, an input unit configured to receive an input of a user, and a controller configured to control the power supply unit and the gas flow rate adjustment unit according to the input; and a handpiece including a boosting transformer configured to boost the AC signal, an electrode structure configured to receive the boosted AC signal and the gas and form plasma, a switch configured to receive a plasma discharge signal of the user, and a nozzle configured to discharge the formed plasma, wherein the handpiece is connected to the base via a connector and is exchangeable.

As an example of the plasma device, the power supply unit may include an oscillator configured to form the AC signal from the provided electric power.

As an example of the plasma device, the power supply unit may further include any one of a DC-DC converter configured to receive a direct current (DC) voltage as the electric power and convert a value of the DC voltage, and an AC-DC converter configured to receive an AC voltage as the electric power and convert the provided AC voltage into a DC voltage.

As an example of the plasma device, the gas flow rate adjustment unit may include a valve configured to adjust the flow rate of the output gas according to a signal provided by the controller.

As an example of the plasma device, the input unit may include one or more of an intensity button configured to adjust the ion density of the discharged plasma, a flow rate control button configured to adjust the flow rate of the output gas, and a power button.

As an example of the plasma device, the base may further include a display unit configured to display the input by the input unit.

As an example of the plasma device, the boosting transformer may boost the amplitude of the AC signal to one voltage among 4 kV to 10 kV.

As an example of the plasma device, the plasma device may be connectable to a plurality of different handpieces, and the plurality of handpieces may have different electrode structures.

As an example of the plasma device, the plasma device may be connectable to a plurality of different handpieces, and the plurality of handpieces may have different nozzle structures.

As an example of the plasma device, the plasma device may be connectable to a plurality of different handpieces, and the plurality of handpieces form the plasma in different modes.

As an example of the plasma device, the base may be connected to a gas tube configured to provide the output gas to the handpiece through a power line configured to provide the AC signal to the handpiece, and the gas tube and the power line may be covered with the same sheath.

According to a plasma device according to the present embodiment, there is provided an advantage in that a handpiece having a desired plasma mode and/or a desired nozzle shape can be used while being coupled to a base.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION

Figure 1:
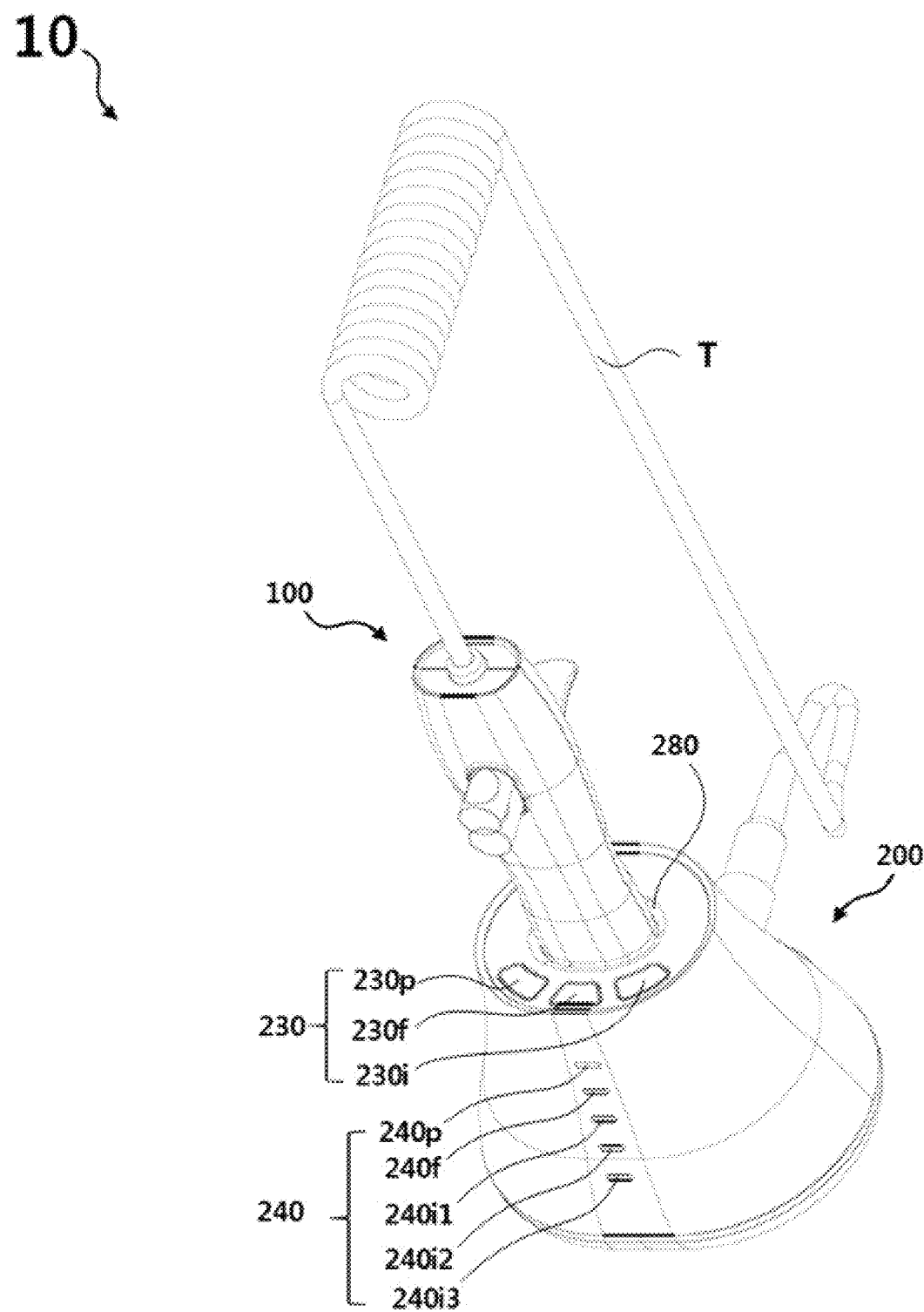
FIG. 1 is a view illustrating a state in which a handpiece of a plasma device is connected to a base and is held in the base according to the present embodiment.

Since the description of the present disclosure is merely an embodiment for structural or functional description, the scope of the present disclosure should not be interpreted as being limited by embodiments described in the text. That is, since the embodiments may be variously changed, and may have various forms, the scope of the present disclosure should be understood to include equivalents that can realize the technical spirit.

Meanwhile, the meaning of terms described in the present application should be understood as follows.

It should be understood that singular expressions include plural expressions unless the context clearly indicates otherwise, and it should be understood that terms such as "include" or "have" are intended to indicate that there is a feature, a number, a step, an operation, a component, a part, or a combination thereof that is implemented, and do not exclude in advance the possibility of the presence or addition of one or more other features, numbers, steps, operations, components, components, or combinations thereof.

Steps may be performed in a different order from a specified order unless the context clearly indicates a specific order. That is, the steps may be performed in the same order as the specified order, may be performed substantially simultaneously, or may be performed in reverse order.

Drawings referenced to describe embodiments of the present disclosure are expressed after being intentionally exaggerated in size, height, and thickness for convenience of description and ease of understanding, and are not enlarged or reduced according to a ratio. Further, certain elements illustrated in the drawings may be intentionally reduced and expressed, and other elements may be intentionally enlarged and expressed.

All terms used herein have the same meanings as those commonly understood by those skilled in the art to which the present disclosure belongs, unless otherwise defined. Terms defined in commonly used dictionaries should be interpreted as having the same meanings in the context of the related art, and may not be interpreted as having ideal or excessively formal meanings, unless explicitly defined in the present application.

Hereinafter, a plasma device according to the present embodiment will be described with reference to the accompanying drawings. The plasma device according to the present embodiment includes: a base including a power supply unit configured to receive electric power and form an AC signal, a gas flow rate adjustment unit configured to receive gas and control the flow rate of output gas, an input unit configured to receive an input of a user, and a controller configured to control the power supply unit and the gas flow rate adjustment unit according to the input; and a handpiece including a boosting transformer configured to boost the AC signal, an electrode structure configured to receive the boosted AC signal and the gas and form plasma, a switch configured to receive a plasma discharge signal of the user, and a nozzle configured to discharge the formed plasma, wherein the handpiece is connected to the base via a connector and is exchangeable.

Figure 2:
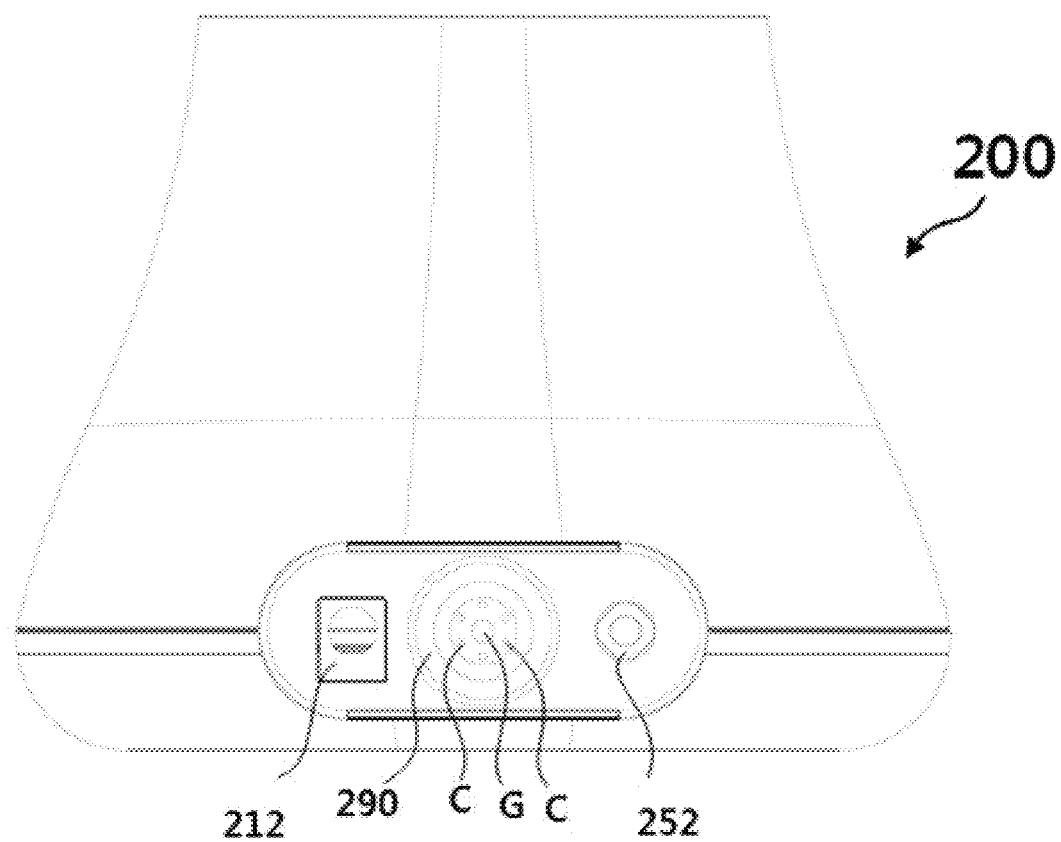
FIG. 2 is a view illustrating one side surface of the base.

FIG. 1 is a view illustrating a state in which a handpiece 100 of a plasma device 10 is connected to a base 200 and is held in the base 200 according to the present embodiment, and FIG. 2 is a view illustrating one side surface of the base 200. In the embodiment illustrated in FIGS. 1 and 2, an opening 280 may be formed in the base 200, and the handpiece 100 may be inserted into and held in the opening 280. In another embodiment that is not illustrated, the base 200 may include a holding part which may hold the handpiece 100 or to which the handpiece 100 is attached using a magnet.

An input unit 230 configured to receive an input of a user may be formed in the base 200. In the embodiment illustrated in FIGS. 1 and 2, the input unit 230 includes a power button 230*p* configured to apply electric power to the plasma device 10 or cut off the electric power, a flow rate control button 230*f* configured to adjust the flow rate of gas forming plasma, and an intensity button 230*i* configured to control the ion density in the plasma.

In the embodiment, when the user pushes the power button 230*p*, the electric power is applied to the plasma device 10, and when the user pushes the power button 230*p* again, the electric power provided to the plasma device 10 is cut off.

Whenever the user pushes the intensity button 230*i*, the ion density in the plasma discharged through the handpiece 100 may be increased, and as an example, when the user pushes the intensity button 230*i* a predetermined number of times, the ion density in the plasma discharged through the handpiece 100 may be reduced to the minimum.

The user may push the flow rate control button 230*f* to provide the gas flowing into the base 200 to the handpiece 100. In the embodiment, the user may push the flow rate control button 230*f* to provide the gas to the handpiece 100 or block the gas from the handpiece 100, and as another example, the user may push the flow rate control button 230*f* to increase or decrease the flow rate of the gas provided to the handpiece 100. In the embodiment, the user may push the flow rate control button 230*f* to increase the flow rate of the gas flowing into the handpiece 100, and when the user pushes the flow rate control button 230*f* a predetermined number of times, the flow rate of the gas flowing into the handpiece 100 may be reduced to the minimum.

A display unit 240 configured to display the input provided through the input unit 230 by the user may be formed in the base 200. As in the embodiment illustrated in FIG. 1, the display unit 240 may be a light emitting device. As an example, when the electric power is applied to the plasma device 10, a light emitting device 240*p* may emit light, and when the electric power to the plasma device 10 is cut off, the light emitting device 240*p* may not emit light. As an example, when the gas flows into the handpiece 100, a light emitting device 240*f* may emit light, and when the gas does not flow into the handpiece 100, the light emitting device 240*f* may not emit light. Light emitting devices 240*i*1, 240*i*2, and 240*i*3 may be turned on or off according to the ion density in the plasma discharged through the handpiece 100, the ion density being set by the user.

Figure 3:
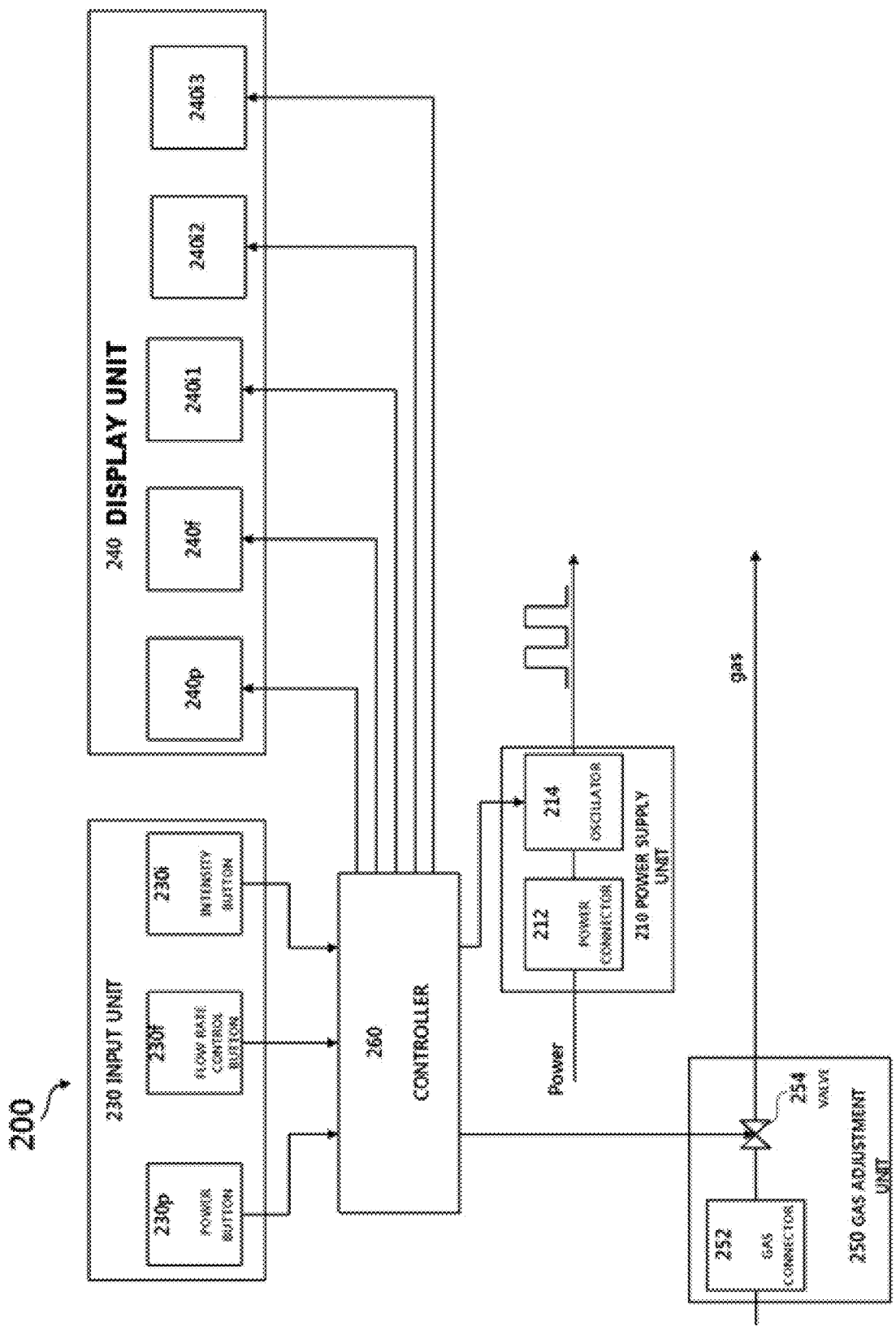
FIG. 3 is a block diagram illustrating an outline of the base.

FIG. 3 is a block diagram illustrating an outline of the base 200. Referring to FIGS. 1 to 3, the base 200 includes: a power supply unit 210 configured to receive the electric power and form a pulse that is an AC signal; a gas adjustment unit 250 configured to receive the gas and control the flow rate of output gas; an input unit 230 configured to receive an input of the user; and a controller 260 configured to control the power supply unit 210 and the gas adjustment unit 250 according the input.

In the embodiment, the base 200 may further include the display unit 240 configured to display the input of the user. As an example, as described above, the display unit 240 includes the light emitting devices 240*p*, 240*f*, 240*i*1, 240*i*2, and 240*i*3 such as light emitting diodes (LEDs). As another example, the display unit 240 may include a display configured to display, in letters and/or numbers, the input provided through the input unit by the user.

The power supply unit 210 includes a power connector 212 connected to an external power source, and an oscillator 214 configured to receive the electric power, convert the electric power into a pulse, and output the converted pulse. In the embodiment, the power connector 212 may be connected to a power source configured to provide a DC voltage, and may output the provided DC voltage to the oscillator 214. The power supply unit 210 may further include a DC-DC converter (not illustrated) configured to convert the level of the provided DC voltage, and may provide the DC voltage converted by the DC-DC converter (not illustrated) to the oscillator 214.

As another embodiment, the power supply unit 210 may include an AC-DC converter (not illustrated) connected to a power source configured to provide an AC voltage and configured to convert the provided AC voltage into a DC voltage having a desired level, and output the converted DC voltage. The power connector 212 is connected to an AC power source to receive the electric power, and provides the received electric power to the AC-DC converter. The AC-DC converter may provide a set DC voltage to the oscillator 214.

The oscillator 214 receives the DC voltage, forms a pulse train from the DC voltage, and outputs the formed pulse train. In the embodiment, the pulse train output by the oscillator 214 may be any one of a pulse train swinging between a positive voltage and the ground voltage, a pulse train swinging between a negative voltage and the ground voltage, and a pulse train swinging between the positive voltage and the negative voltage.

The amplitude of the pulse train output by the oscillator 214 varies according to the intensity adjusted using the intensity button 230i by the user. As an example, when the user adjusts the intensity to the maximum, the pulse train may swing at the maximum amplitude, and when the user adjusts the intensity to the minimum, the pulse train may swing at the minimum amplitude.

The base 200 includes the gas adjustment unit 250. The gas adjustment unit 250 includes a gas connector 252 connected to an external gas source, and a valve 254 controlled by the controller 260 and configured to control the gas provided to the handpiece 100. In the embodiment, the gas connector 252 may have a fastening structure fastened to a gas tube configured to supply the gas. As an example, the gas may be any one of argon (Ar) gas, nitrogen ($N_2$) gas, helium (He) gas, oxygen ($O_2$) gas, and a mixture of two or more thereof.

In the embodiment, the valve 254 may be a valve configured to control a flow rate provided according to a control signal provided by the controller 260. As an example, the valve 254 is a solenoid valve 254, and may control the supply and cut-off of the gas or perform adjustment to increase or decrease the flow rate of the provided gas.

The user provides the input of the user to the controller 260 through the input unit 230. As described above, the controller 260 may control the oscillator 214, the valve 254, and the display unit 240 according to the provided input.

Figure 4A:
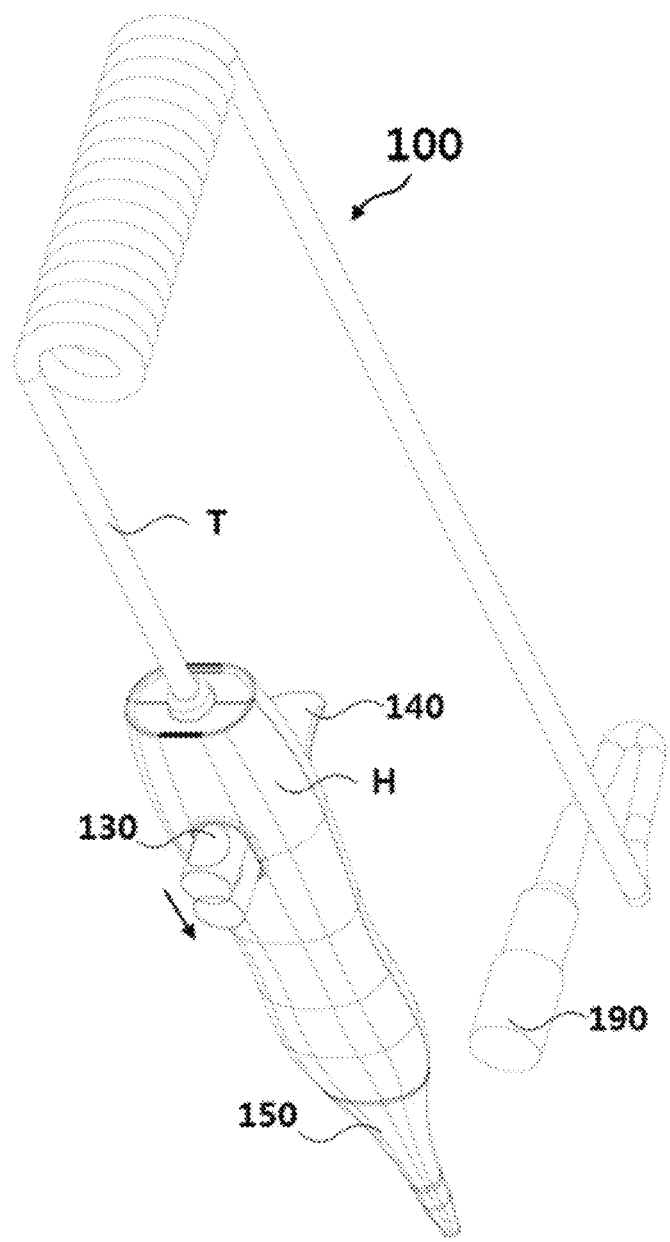
FIG. 4A is a perspective view of the handpiece.
Figure 4B:
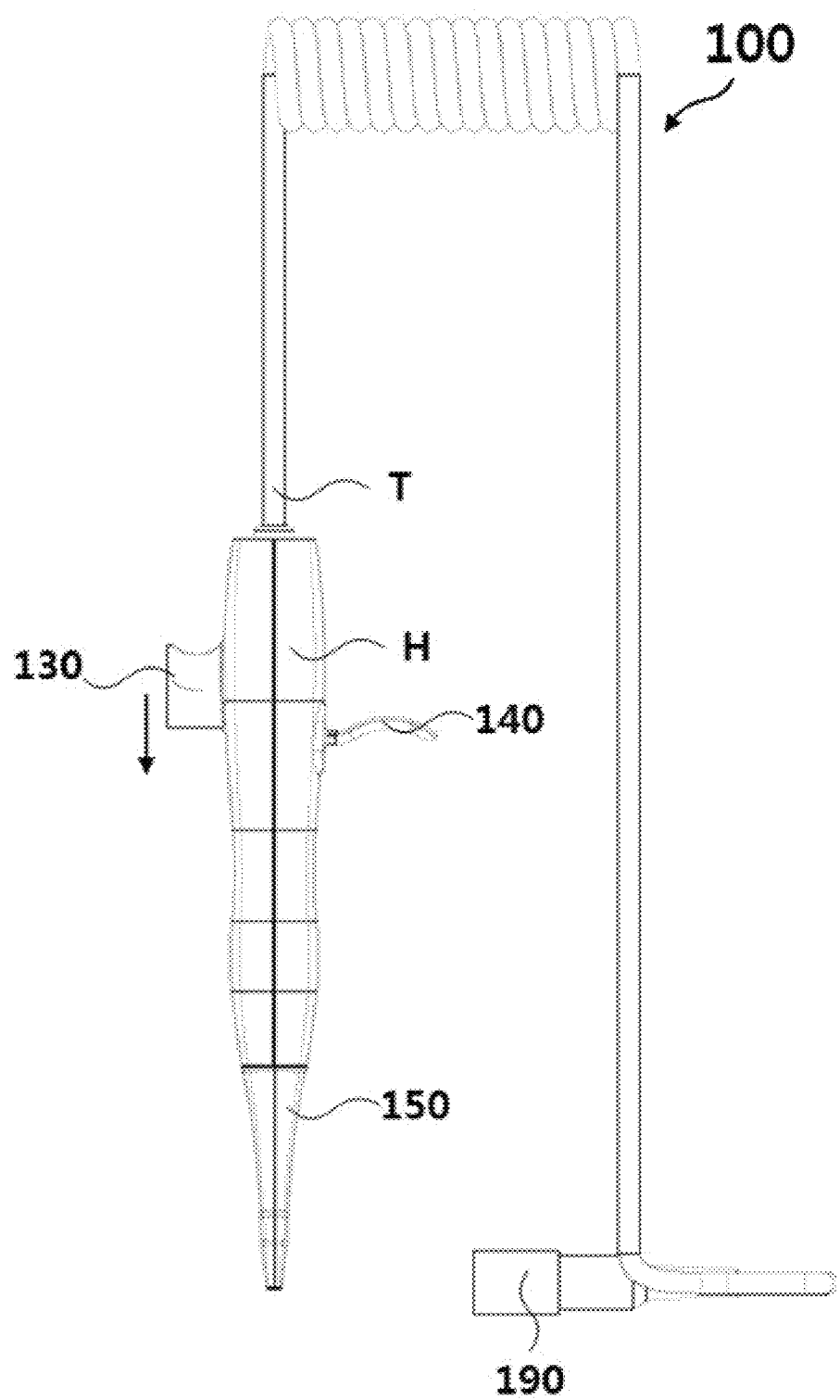
FIG. 4B is a side view of the handpiece.
Figure 5:
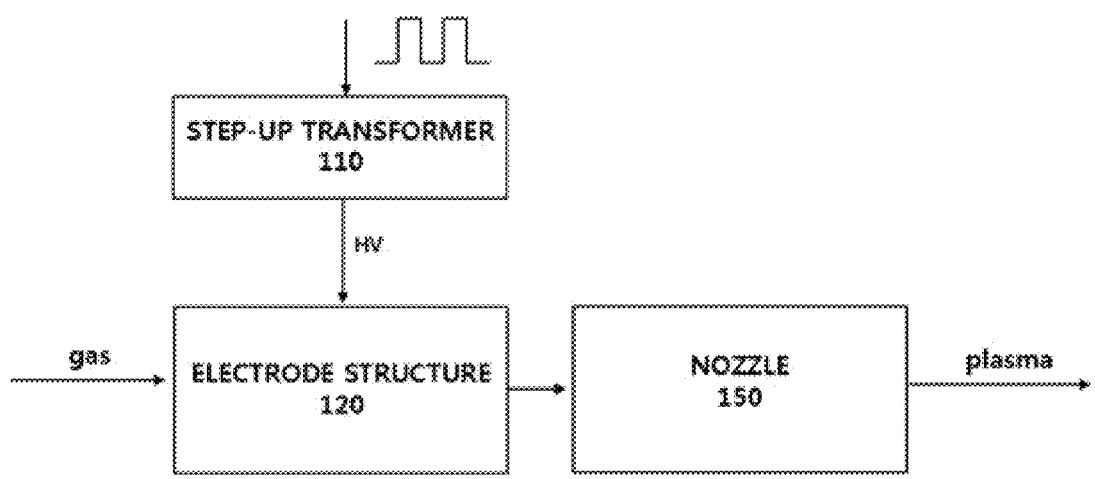
FIG. 5 is a block diagram illustrating an outline of the handpiece.

FIG. 4A is a perspective view of the handpiece 100, and FIG. 4B is a side view of the handpiece 100. FIG. 5 is a block diagram illustrating an outline of the handpiece 100. Referring to FIGS. 4A, 4B, and 5, the handpiece 100 includes a boosting transformer 110 configured to boost the AC signal output by the oscillator 214 (see FIG. 3), an electrode structure 120 to which the boosted AC signal and the gas are provided and which forms plasma, a switch 130 configured to receive a plasma discharge signal of the user, and a nozzle 150 configured to discharge the formed plasma.

The handpiece 100 includes the switch 130 configured to control the discharge of the plasma. According to the illustrated embodiment, the user may control the handpiece 100 to discharge the plasma by gripping the handpiece 100 and pushing the switch 130 in the arrow direction.

In the embodiment, the handpiece 100 may further include a finger engaging member 140 that can prevent accident missing of the handpiece 100 when the user grips the handpiece 100. With regard to the finger engaging member 140, when the user grips the handpiece 100, the user grips the finger engaging member 140 between fingers such as between an index finger and a middle finger or between the middle finger and a ring finger, and may thus grip the handpiece 100 more stably.

The handpiece 100 receives the gas and a pulse signal formed by the oscillator 214 through a tube T. In the embodiment illustrated in FIGS. 4A and 4B, the tube T covers a gas tube 122 (see FIG. 6) and a power line through which the pulse signal is transmitted with a single sheath.

The boosting transformer 110 receives the pulse train output by the oscillator 214 (see FIG. 3) through the power line included in the tube T, boosts the pulse train, and provides the boosted pulse train to the electrode structure 120. As an example, the boosting transformer 110 applies a high voltage HV formed by boosting the amplitude of the provided pulse train to 4 to 10 kV to the electrode structure 120.

Figure 6:
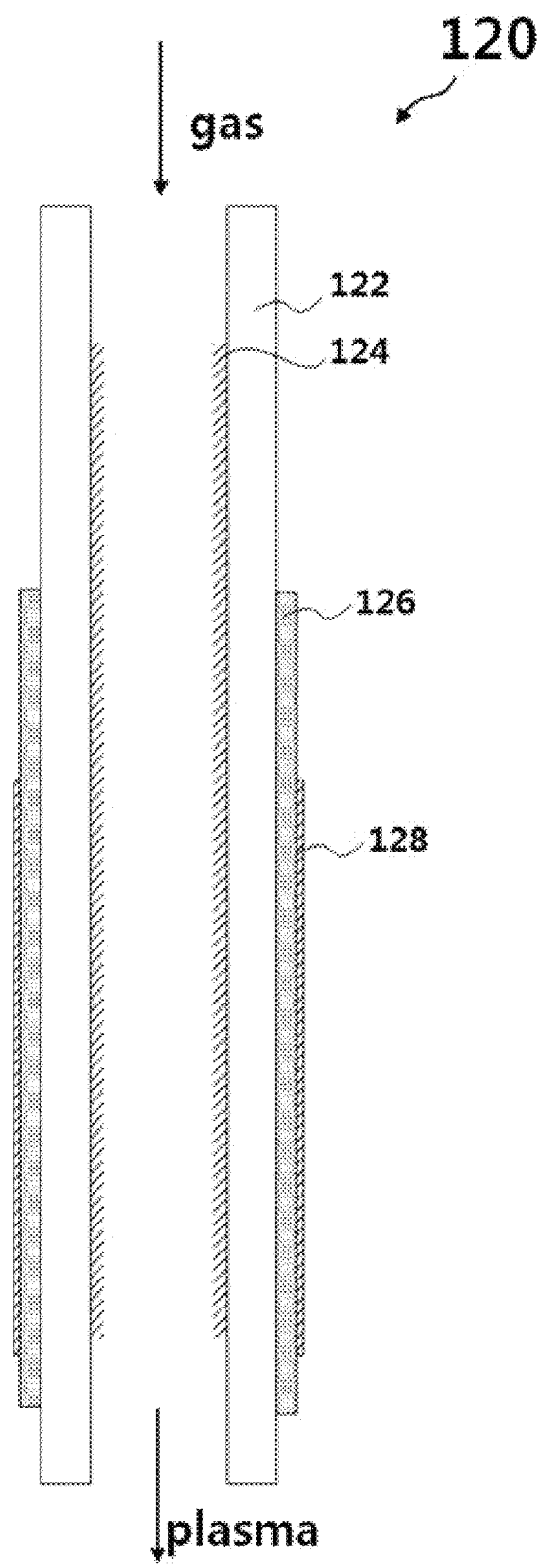
FIG. 6 is a view schematically illustrating an embodiment of an electrode structure for forming plasma.

The gas provided in the electrode structure 120 is converted into the plasma by the high voltage HV applied to the electrode structure 120. FIG. 6 is a view schematically illustrating an embodiment of the electrode structure 120 for forming plasma. Referring to FIG. 6, the electrode structure 120 includes a tube 122 through which the gas flows and the formed plasma is guided, a first electrode 124 formed on an inner surface of the tube 122, a second electrode 128 formed on an outer surface of the tube 122, and a dielectric 126 located between the outer surface of the tube 122 and the second electrode 128.

The gas flows into one end of the tube 122. As an example, the tube 122 included in the electrode structure 120 and the gas tube included in the tube T (see FIG. 1) connected to the handpiece 100 may be formed integrally. As another example, the tube T (see FIG. 1) connected to the handpiece 100 may be coupled and connected to the tube 122 of the electrode structure 120. The tube 122 included in the electrode structure 120 may be made of a material having strong durability against the formed plasma, and may be made of a synthetic resin material.

The first electrode 124 may be formed inside the tube 122, and as an example, the first electrode 124 may be an electrode made of a metal material having good conductivity. The second electrode 128 may be formed outside the tube 122, and as an example, the second electrode 128 may be made of a metal material having good conductivity.

The dielectric 128 is located between the outer surface of the tube 122 and the second electrode 128, and insulates the high voltage HV applied between the first electrode 124 and the second electrode 128. In the embodiment, the dielectric 128 may be made of a ceramic material.

In the embodiment, when the high voltage HV is applied to the first electrode 124 and the ground voltage is provided to the second electrode 128, direct mode plasma is formed in the electrode structure 120. The formed plasma is guided to the nozzle 150 through an end of the tube 122 toward a ground electrode by an electric field. The direct mode plasma has a long life time, so that a distance between the end of the tube 122 and the nozzle 150 may be formed long.

As another embodiment, when the ground voltage is provided to the first electrode 124, and the high voltage HV is provided to the second electrode 128, remote mode plasma is formed in the electrode structure 120. The formed plasma is guided to the nozzle 150 through the end of the tube 122 by the inflow pressure of the gas. A distance between the tube 122 and the nozzle 150 in the electrode structure 120 forming the remote mode plasma may be smaller than a distance between the tube 122 and the nozzle 150 in the electrode structure 120 forming the direct mode plasma.

Figure 7A:
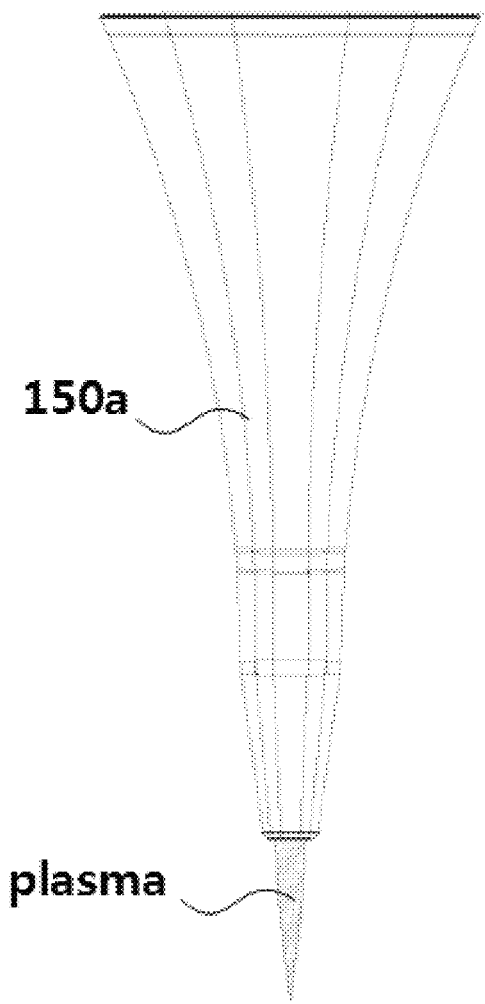
FIGS. 7A to 7C are views schematically illustrating embodiments of a nozzle.
Figure 7B:
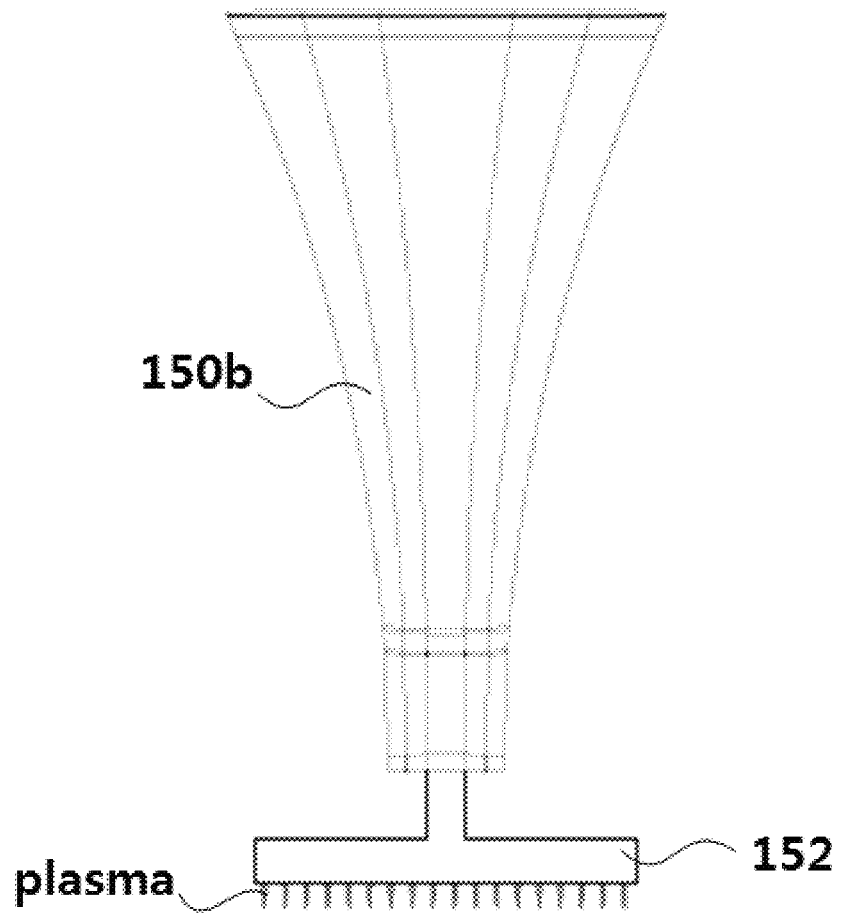
Figure 7C:
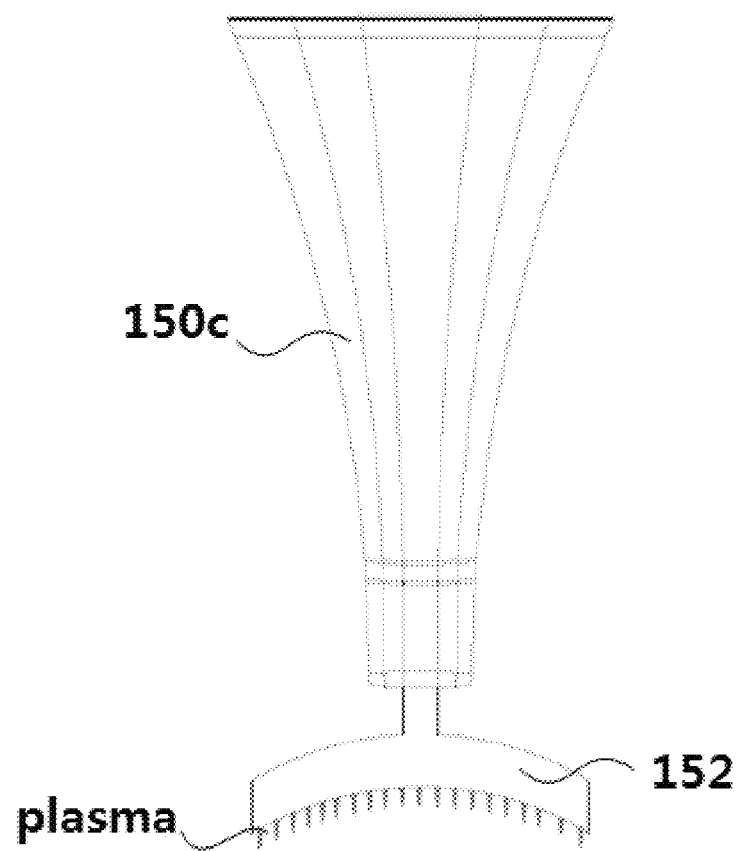

FIGS. 7A to 7C are views schematically illustrating embodiments of a nozzle. A nozzle 150a illustrated in FIG. 7A has a single outlet. The nozzle 150a having the single outlet may perform treatment by intensively providing the plasma to one place.

A nozzle 150b illustrated in FIG. 7B has a plurality of outlets formed in a flat discharge part 152. The discharge part 152 may have a polygonal shape such as a circle, a quadrangle, and a triangle, and it is easy for the discharge part 152 to discharge the plasma to a flat object to be treated. The nozzle 150b having the plurality of outlets may perform treatment using the plasma by providing the plasma to a larger area.

In a nozzle 150c illustrated in FIG. 7C, the discharge part 152 where the outlets are located is formed in a curved shape. The discharge part 152 may have a polygonal shape such as a circle, a quadrangle, and a triangle, and since the discharge part 152 is formed in a curved shape, even when the object to be treated with the plasma has a curved surface, the plasma may be effectively provided to perform the treatment.

The plurality of above-described nozzles 150a, 150b, and 150c are coupled to the handpiece 100, and there is provided an advantage in that the user may use the base 200 and the handpiece 100 after the base 200 and the handpiece 100 are attached to or detached from each other depending on the object to be treated with the plasma. As an example, when a spot is to be treated with the plasma, the handpiece 100 including the nozzle 150a having the single outlet is coupled to the base 200 to perform the plasma treatment, and when a flat surface such as a test slide is to be treated with the plasma, the handpiece 100 including the nozzle 150b having the flat discharge part 152 with the plurality of outlets may be used while being coupled to the base 200.

A handpiece coupling connector 290 (see FIG. 2) is formed in the base 200, and a base coupling connector 190 corresponding to the handpiece coupling connector 290 (see FIG. 2) is formed at an end of the tube T (see FIG. 4) included in the handpiece 100. The base coupling connector 190 and the handpiece coupling connector 290 may be connected in correspondence with each other.

In the embodiment, in the center of the handpiece coupling connector 290, a gas connection port G connecting the gas whose flow rate is adjusted according to the input of the user to the handpiece 100 may be disposed, and electrodes C connected to conductive lines to surround the gas connection port G may be arranged.

In the embodiment, the base coupling connector 190 and the handpiece coupling connector 290 may be coupled to each other to transmit an electrical signal between the base 200 and the handpiece 100. As an example, one or more electrodes C are located at positions corresponding to each other in the base coupling connector 190 and the handpiece coupling connector 290. The electrodes C located in the base coupling connector 190 and the handpiece coupling connector 290 are electrically connected to each other, so that a signal for controlling the amplitude of the pulse train output by the boosting transformer 110 to correspond to the input provided by the user through the input unit 230 may be provided to the handpiece 100. Further, the electrodes C located in the base coupling connector 190 and the handpiece coupling connector 290 are electrically connected to each other, so that a signal provided by the user through the switch 130 may be provided to the base 200 such that the handpiece 100 discharges the plasma.

Further, the gas connection ports G are located at positions corresponding to each other in the base coupling connector 190 and the handpiece coupling connector 290. When the base coupling connector 190 and the handpiece coupling connector 290 are coupled to each other, the gas connection ports G are fastened to each other, so that the gas may be provided from the gas adjustment unit 250 to the handpiece 100.

As described above, the different nozzles 150a, 150b, and 150c may be formed in the handpiece 100, and the same base coupling connector 190 may be formed in each handpiece 100. Thus, the handpiece 100 corresponding to the purpose for which the user wants to use the handpiece 100 may be easily connected to the base 200 using the base coupling connector 190 and the handpiece coupling connector 290.

Although the present disclosure has been described with reference to the embodiments illustrated in the drawings to help understanding of the present disclosure, the description is an embodiment for implementation, and is merely illustrative, and those skilled in the art may thus understand that various modifications and equivalent other embodiments may be derived from the description. Thus, the true technical scope of the present disclosure should be determined by the appended claims.

What is claimed is:

1. A plasma device comprising:
  a base including a power supply unit configured to receive electric power and form an alternating current (AC) signal, a gas flow rate adjustment unit configured to receive gas and control a flow rate of output gas, an input unit configured to receive an input of a user, and a controller configured to control the power supply unit and the gas flow rate adjustment unit according to the input;
  a handpiece including a boosting transformer configured to boost the AC signal, an electrode structure configured to receive the boosted AC signal and the gas and form plasma, a switch configured to receive a plasma discharge signal of the user, and a nozzle configured to discharge the formed plasma; and
  a tube through which the gas flows and including a connector which interchangeably connects the handpiece to the base such that the handpiece is exchangeably connected to the base via the connector,
  wherein the tube is elongated into the handpiece,
  wherein the handpiece further includes
    a first electrode formed inside the tube,
    a second electrode disposed outside the tube, and
    a dielectric material layer interposed between the first electrode and the second electrode and disposed on an outer surface of the tube,
  wherein the handpiece is configured to form the plasma in different modes by controlling a polarity of a voltage applied to the first electrode and the second electrode, and
  wherein the modes of the plasma include
    a direct mode generated when a ground voltage is applied to the second electrode and a first voltage other than the ground voltage is applied to first electrode, and a remote mode generated when the ground voltage is applied to the first electrode and the first voltage or a second voltage other than the ground voltage is applied to the second electrode.

2. The plasma device of claim 1, wherein the power supply unit comprises an oscillator configured to form the AC signal from the provided electric power.

3. The plasma device of claim 2, wherein the power supply unit further comprises any one of a DC-DC converter configured to receive a direct current (DC) voltage as the electric power and convert a value of the DC voltage, and an AC-DC converter configured to receive an AC voltage as the electric power and convert the provided AC voltage into a DC voltage.

4. The plasma device of claim 1, wherein the gas flow rate adjustment unit comprises a valve configured to adjust the flow rate of the output gas according to a signal provided by the controller.

5. The plasma device of claim 1, wherein the input unit comprises one or more of an intensity button configured to adjust an ion density of the discharged plasma, a flow rate control button configured to adjust the flow rate of the output gas, and a power button.

6. The plasma device of claim 1, wherein the base further comprises a display unit configured to display the input by the input unit.

7. The plasma device of claim 1, wherein the boosting transformer boosts an amplitude of the AC signal to one voltage among 4 kV to 10 kV.

8. The plasma device of claim 1, wherein:
the plasma device is connectable to a plurality of different handpieces; and
the plurality of handpieces have different electrode structures.

9. The plasma device of claim 1, wherein:
the plasma device is connectable to a plurality of different handpieces; and
the plurality of handpieces have different nozzle structures.

10. The plasma device of claim 1, wherein:
the base is connected to a gas tube configured to provide the output gas to the handpiece through a power line configured to provide the AC signal to the handpiece; and
the gas tube and the power line are covered with the same sheath.

* * * * *